United States Patent
Park et al.

(10) Patent No.: US 9,711,522 B2
(45) Date of Patent: Jul. 18, 2017

(54) MEMORY HOLE STRUCTURE IN THREE DIMENSIONAL MEMORY

(71) Applicant: SANDISK TECHNOLOGIES LLC, Plano, TX (US)

(72) Inventors: Chan Park, Mountain View, CA (US); Jong Sun Sel, Los Gatoes, CA (US); Tuan Pham, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 183 days.

(21) Appl. No.: 14/506,477

(22) Filed: Oct. 3, 2014

(65) Prior Publication Data

US 2016/0099254 A1    Apr. 7, 2016

(51) Int. Cl.
| | |
|---|---|
| *H01L 21/28* | (2006.01) |
| *H01L 27/115* | (2017.01) |
| *H01L 27/11582* | (2017.01) |
| *H01L 27/11565* | (2017.01) |
| *H01L 27/11519* | (2017.01) |
| *H01L 27/11556* | (2017.01) |
| *G11C 8/14* | (2006.01) |
| *G11C 16/04* | (2006.01) |
| *G11C 7/18* | (2006.01) |

(52) U.S. Cl.
CPC ......... *H01L 27/11582* (2013.01); *G11C 8/14* (2013.01); *G11C 16/0466* (2013.01); *G11C 16/0483* (2013.01); *H01L 27/11519* (2013.01); *H01L 27/11556* (2013.01); *H01L 27/11565* (2013.01); *G11C 7/18* (2013.01)

(58) Field of Classification Search
CPC ......... H01L 21/28282; H01L 27/11563; H01L 27/11565; H01L 27/11568; H01L 27/1157; H01L 27/11578; H01L 27/11582; H01L 29/66833; H01L 29/792; H01L 29/7926; H01L 27/11556; H01L 27/11519; H01L 27/11529
See application file for complete search history.

(56) References Cited

U.S. PATENT DOCUMENTS

| | | | |
|---|---|---|---|
| 7,023,739 B2 | 4/2006 | Chen et al. | |
| 7,233,522 B2 | 6/2007 | Chen et al. | |
| 7,848,145 B2 | 12/2010 | Mokhlesi et al. | |
| 8,148,763 B2 * | 4/2012 | Kim | G11C 5/02 257/296 |
| 8,187,936 B2 | 5/2012 | Alsmeier et al. | |
| 8,283,228 B2 | 10/2012 | Alsmeier et al. | |
| 8,836,137 B2 * | 9/2014 | Chen | H01L 21/6835 257/208 |
| 9,230,974 B1 * | 1/2016 | Pachamuthu | H01L 27/1157 |
| 9,230,980 B2 * | 1/2016 | Rabkin | G11C 16/0483 |
| 9,419,010 B2 * | 8/2016 | Shih | H01L 27/11582 |
| 9,443,866 B1 * | 9/2016 | Sakakibara | H01L 27/11582 |
| 2010/0001250 A1 | 1/2010 | Liu | |

(Continued)

*Primary Examiner* — Mary Wilczewski
(74) *Attorney, Agent, or Firm* — Foley & Lardner LLP

(57) ABSTRACT

In a three dimensional nonvolatile memory, memory holes extend vertically through two or more physical levels in which memory cells are formed. Memory hole structures are formed in memory holes to include vertical channels. Vertical trenches are subsequently formed to divide memory hole structures into two or more vertical NAND strings.

13 Claims, 19 Drawing Sheets

(56) References Cited

U.S. PATENT DOCUMENTS

| | | | |
|---|---|---|---|
| 2012/0001249 A1* | 1/2012 | Alsmeier | H01L 27/11551 257/319 |
| 2013/0078776 A1* | 3/2013 | Kim | H01L 21/3105 438/268 |
| 2013/0229846 A1 | 9/2013 | Chien et al. | |
| 2014/0149641 A1 | 5/2014 | Avila et al. | |
| 2014/0220750 A1* | 8/2014 | Sohn | H01L 27/11556 438/269 |
| 2015/0123189 A1* | 5/2015 | Sun | H01L 27/11556 257/321 |
| 2015/0243674 A1* | 8/2015 | Shih | H01L 27/11582 438/268 |
| 2015/0380427 A1* | 12/2015 | Sasaki | H01L 27/11582 257/324 |
| 2016/0064498 A1* | 3/2016 | Liu | H01L 27/11582 257/324 |
| 2016/0099254 A1* | 4/2016 | Park | H01L 27/11582 257/324 |
| 2016/0260736 A1* | 9/2016 | Fujii | H01L 27/11568 |
| 2016/0268282 A1* | 9/2016 | Ishibashi | H01L 27/11568 |

* cited by examiner

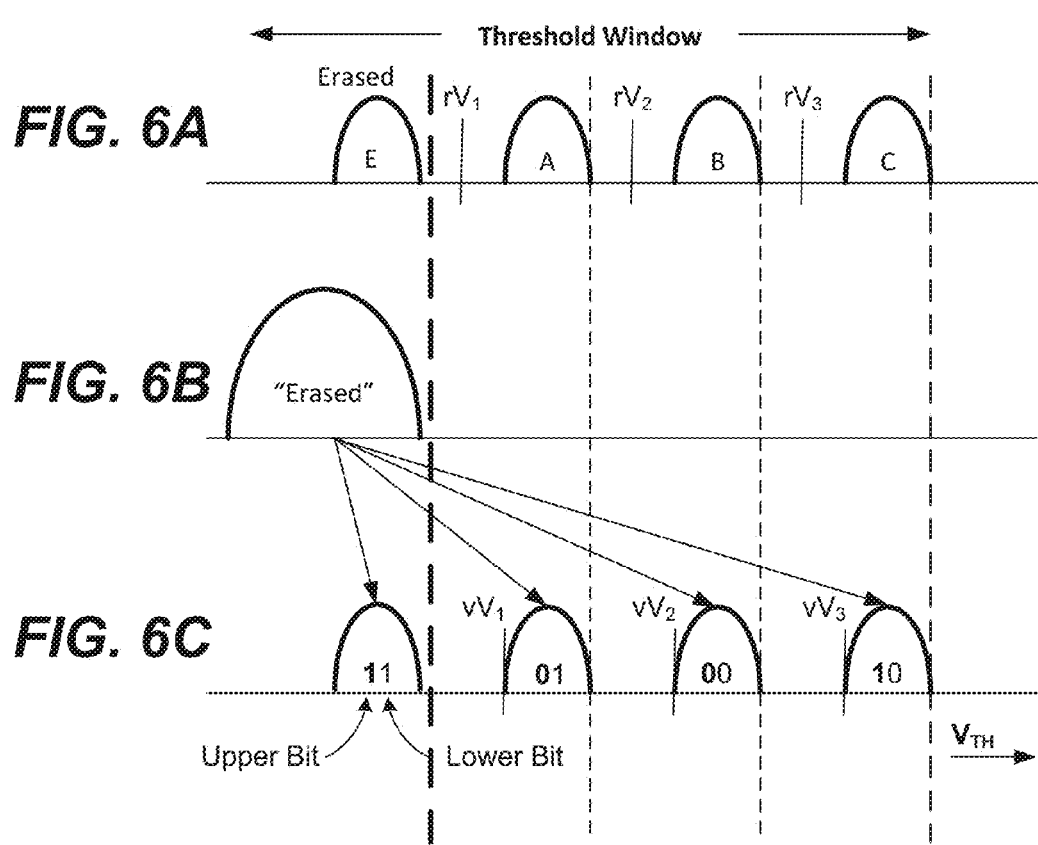
Programming into four states represented by a 2-bit code

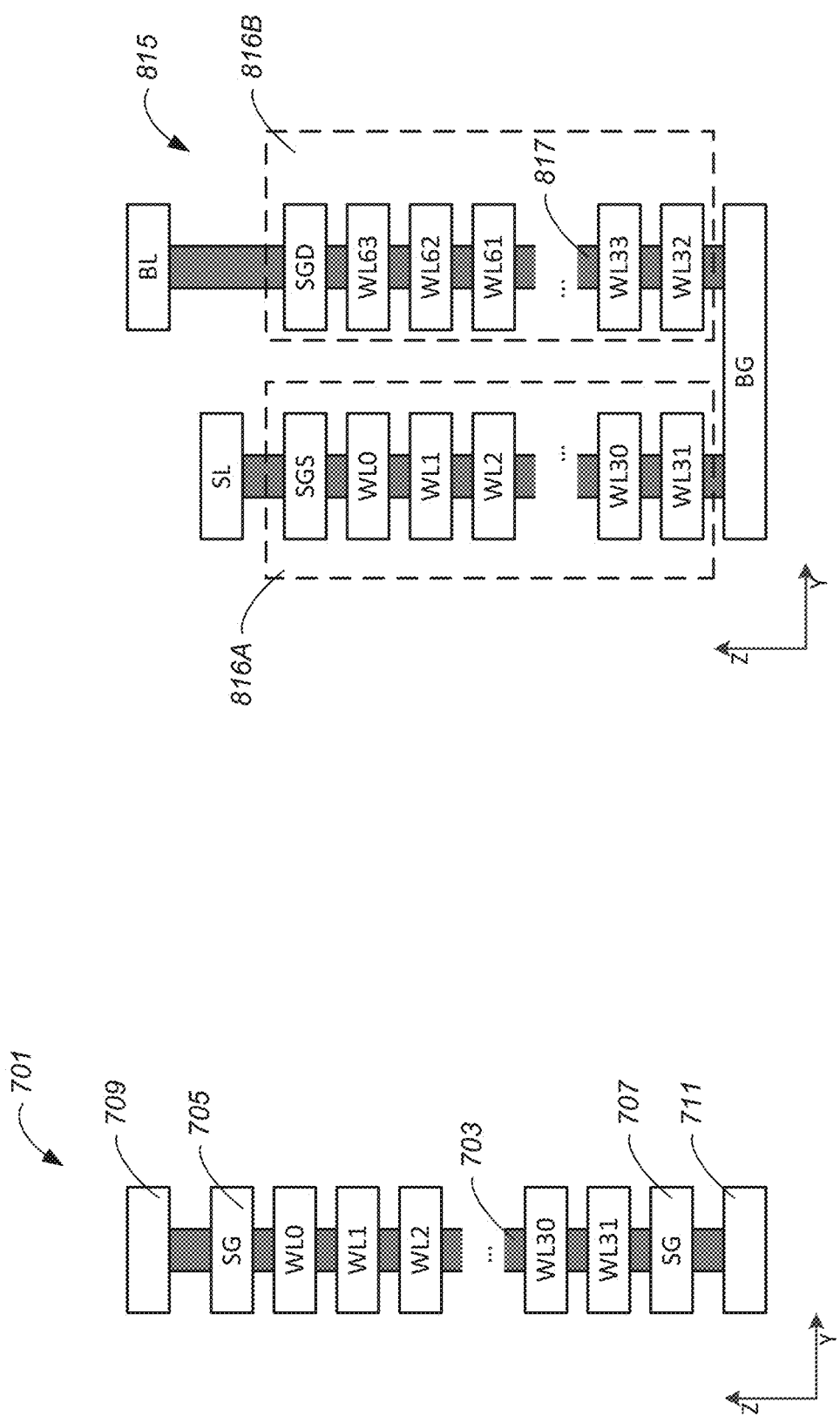

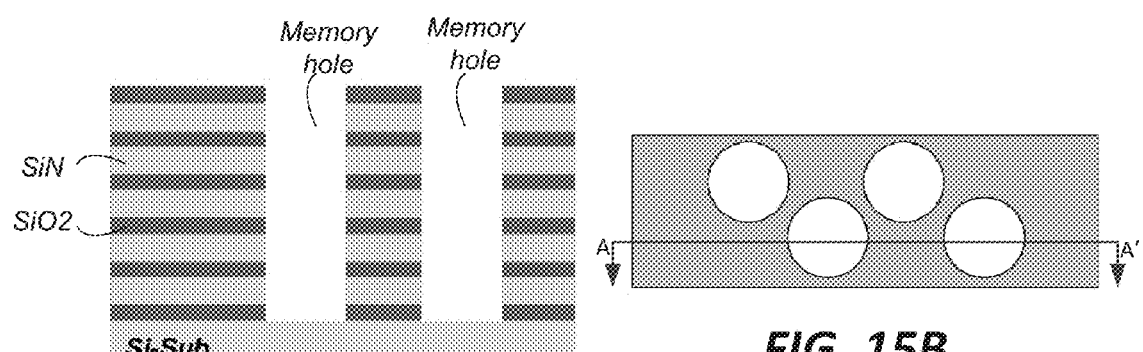
FIG. 15A
FIG. 15B
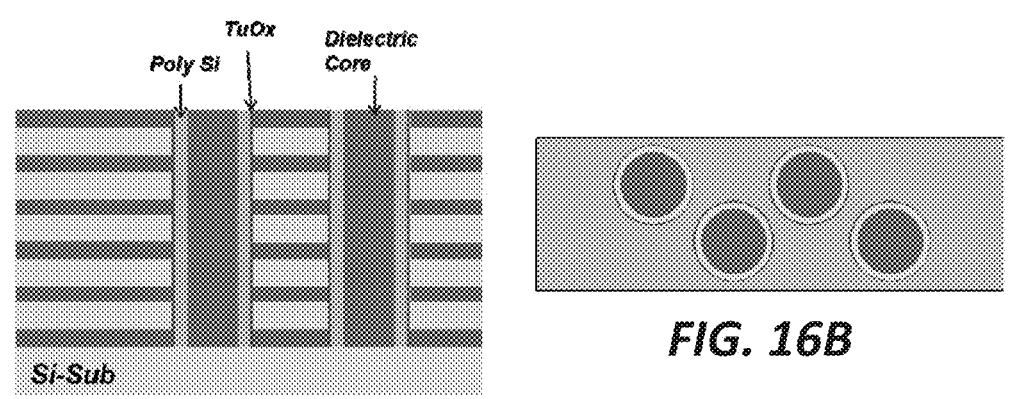
FIG. 16A
FIG. 16B
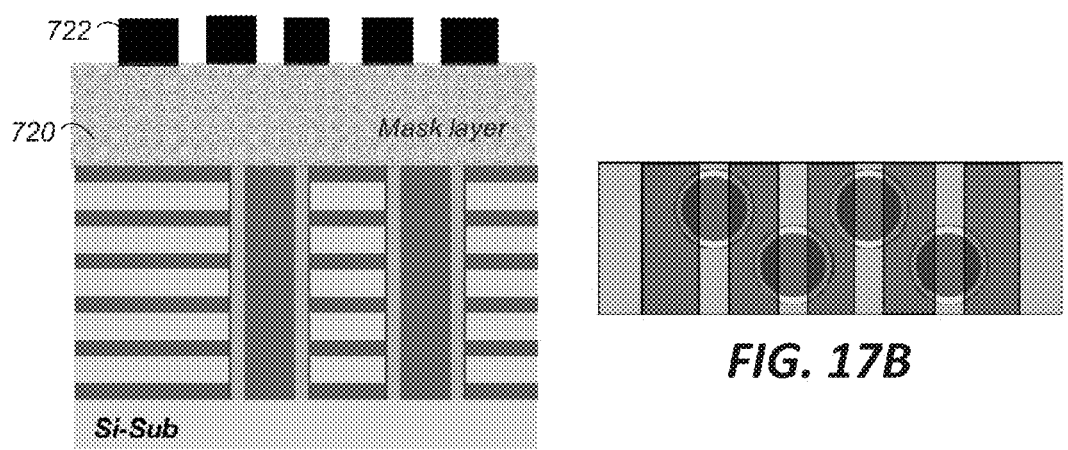
FIG. 17A
FIG. 17B

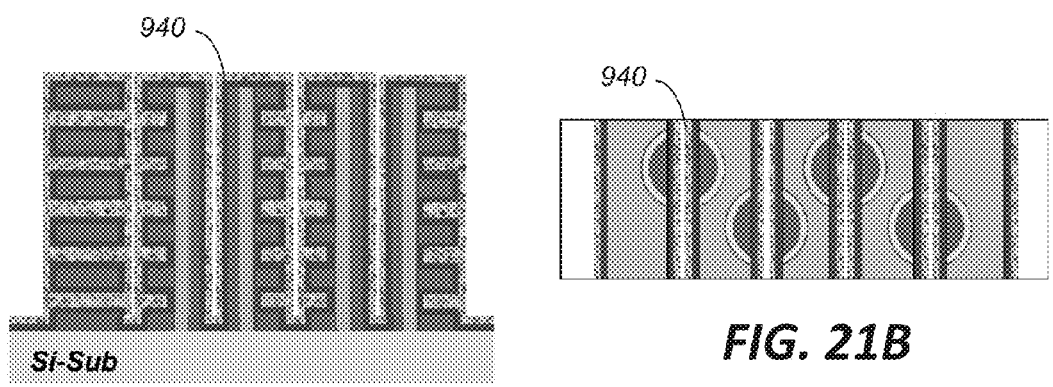
FIG. 21A  FIG. 21B
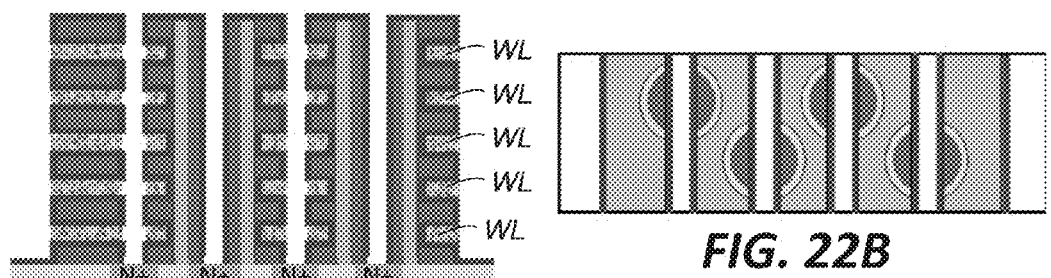
FIG. 22A  FIG. 22B

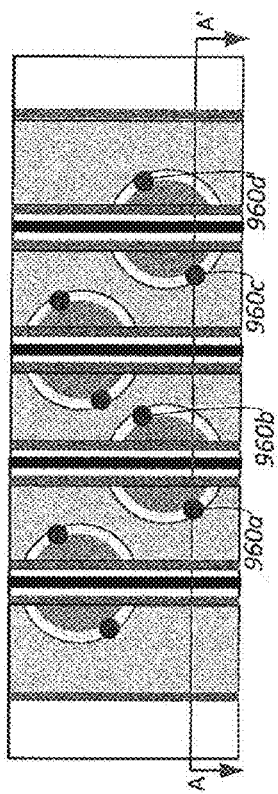
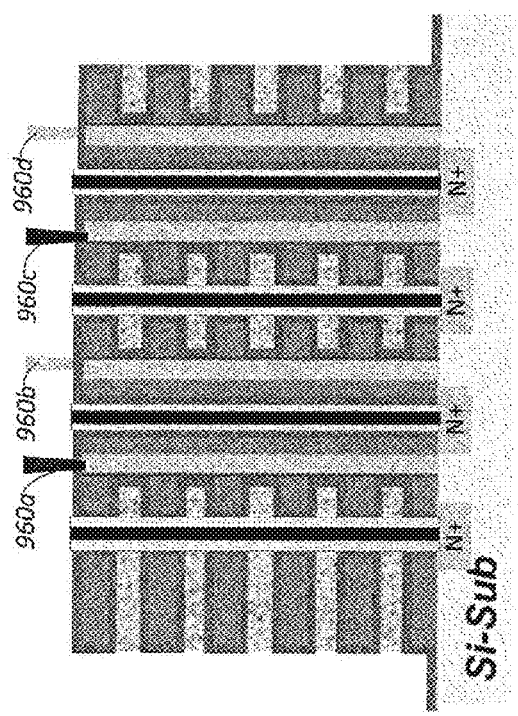
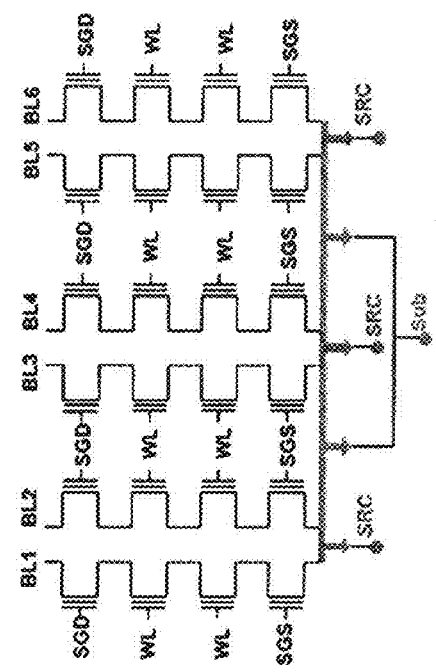
FIG. 24B
FIG. 24A
FIG. 25

MEMORY HOLE STRUCTURE IN THREE DIMENSIONAL MEMORY

BACKGROUND

This application relates to the operation of re-programmable nonvolatile three dimensional memory such as semiconductor flash memory, including methods of forming such memories.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that is applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

0Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are monolithically formed in one or more physical levels of memory cells having active areas disposed above a substrate.

SUMMARY

In some three-dimensional block-erasable nonvolatile memory systems, memory cells are formed in memory holes that extend through multiple physical levels. After formation of memory hole structures in memory holes, trenches may be formed to divide memory hole structures and thereby form two or more memory cells in the memory hole at each physical level. Separate NAND strings may be formed in a memory hole in this way. For example, two NAND strings may be formed, one on each side of a trench that bisects a memory hole. Within trenches source conductors may be formed that extend to the substrate and make electrical contact with the substrate. The area of the substrate that is contacted may be appropriately doped to form an electrical connection to channels on either side of the trench and with the substrate.

An example of a method of monolithically forming a three dimensional nonvolatile memory in two or more physical levels of memory cells having active areas disposed above a substrate includes: forming a memory hole that extends through the two or more physical levels; forming a memory hole structure in the memory hole, the memory hole structure including a charge trapping layer and a channel layer; and subsequently forming a vertical trench that intersects the memory hole and that divides the memory hole structure.

A vertical source conductor may be formed in the vertical trench. The vertical trench may be aligned with a previously formed implanted area in the substrate and the vertical source conductor may make contact with the implanted area. The vertical trench and the vertical source conductor may extend to the substrate. The vertical trench may divide the channel layer into a plurality of separate channels and the vertical source conductor may be electrically connected to the plurality of separate channels at the substrate. The vertical source conductor may be electrically connected to the substrate. The vertical trench may divide the charge trapping layer into a plurality of separate charge trapping portions, each of the plurality of separate charge trapping portions forming charge trapping elements of a corresponding NAND string. A plurality of drain contacts may be formed for the plurality of separate channels, each of the plurality of separate channels having a separate drain contact. A plurality of drain contacts may be formed for the plurality of separate channels, the plurality of drain contacts connected in one or more pairs, a pair consisting of a drain contact on a first side of the vertical trench and a drain contact on a second side that is an opposing side of the vertical trench to the first side. A drain contact on the first side of the vertical trench may connect to a first channel selected by a first select line and a drain contact on the second side of the vertical trench may connect to a second channel selected by a second select line. Additional memory hole structures may be formed in additional memory holes and the vertical trench may be formed such that the vertical trench intersects the additional memory holes and divides the additional memory hole structures.

An example of a three dimensional nonvolatile memory monolithically formed in two or more physical levels of memory cells having an active area disposed above a substrate includes: a memory hole that extends through the two or more physical levels; a channel layer that extends within the memory hole; a vertical trench that intersects the memory hole and divides the channel layer into a plurality of vertical channels; and a source conductor located in the vertical trench.

The vertical trench may bisect the channel layer to form two vertical channels within the memory hole. The plurality of vertical channels may extend to the substrate, the source conductor may extend to the substrate, and the source conductor may form an electrical connection with the plurality of channels at the substrate. The source conductor may directly contact the substrate and may form an electrical connection with the substrate. A charge trapping layer may extend within the memory hole, the vertical trench dividing the charge trapping layer into a plurality of charge trapping portions that form charge trapping elements of memory cells of a corresponding plurality of vertical NAND strings. The charge trapping layer may be divided into two charge trapping portions that form charge trapping elements of memory cells of two vertical NAND strings in the memory hole. The charge trapping layer may be divided into four charge trapping portions that form charge trapping elements of memory cells of four vertical NAND strings in the memory hole.

An example of a method of monolithically forming a three dimensional nonvolatile memory in two or more physical levels of memory cells having active areas disposed above a substrate includes: forming a plurality of memory holes that extend vertically through the two or more physical levels; forming a memory hole structure in each of the plurality of memory holes, an individual memory hole structure including a charge trapping layer and a channel layer; subsequently forming a vertical trench that intersects the plurality of memory holes and that divides each of the plurality of memory hole structures to form separate channels on either side of the vertical trench; and subsequently forming a vertical source conductor in the trench, the vertical source conductor forming a common source connection to the separate channels of the plurality of memory holes.

Drain connections to the separate channels may be formed at a level above the two or more physical levels, the drain connections connecting the separate channels to bit lines. The vertical trench may be formed at a location that is aligned with a doped area of the substrate that was doped prior to formation of the trench.

Various aspects, advantages, features and embodiments are included in the following description of examples, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIGS. 15A-B show a portion of a memory die at an intermediate stage of fabrication.

FIGS. 16A-B show the structure of FIGS. 15A-B after formation of tunnel oxide, channel polysilicon, and core dielectric in memory holes.

FIGS. 17A-B show the structure of FIGS. 16A-B with patterned resist and a mask layer.

FIGS. 21A-B show the structure of FIGS. 20A-B after deposition of metal.

FIGS. 22A-B show the structure of FIGS. 21A-B after removal of excess metal.

FIGS. 24A-B show the structure of FIGS. 23A-B after formation of drain contacts.

FIG. 25 is an electrical schematic corresponding to FIG. 24A.

DETAILED DESCRIPTION

Memory System

Figure 1:
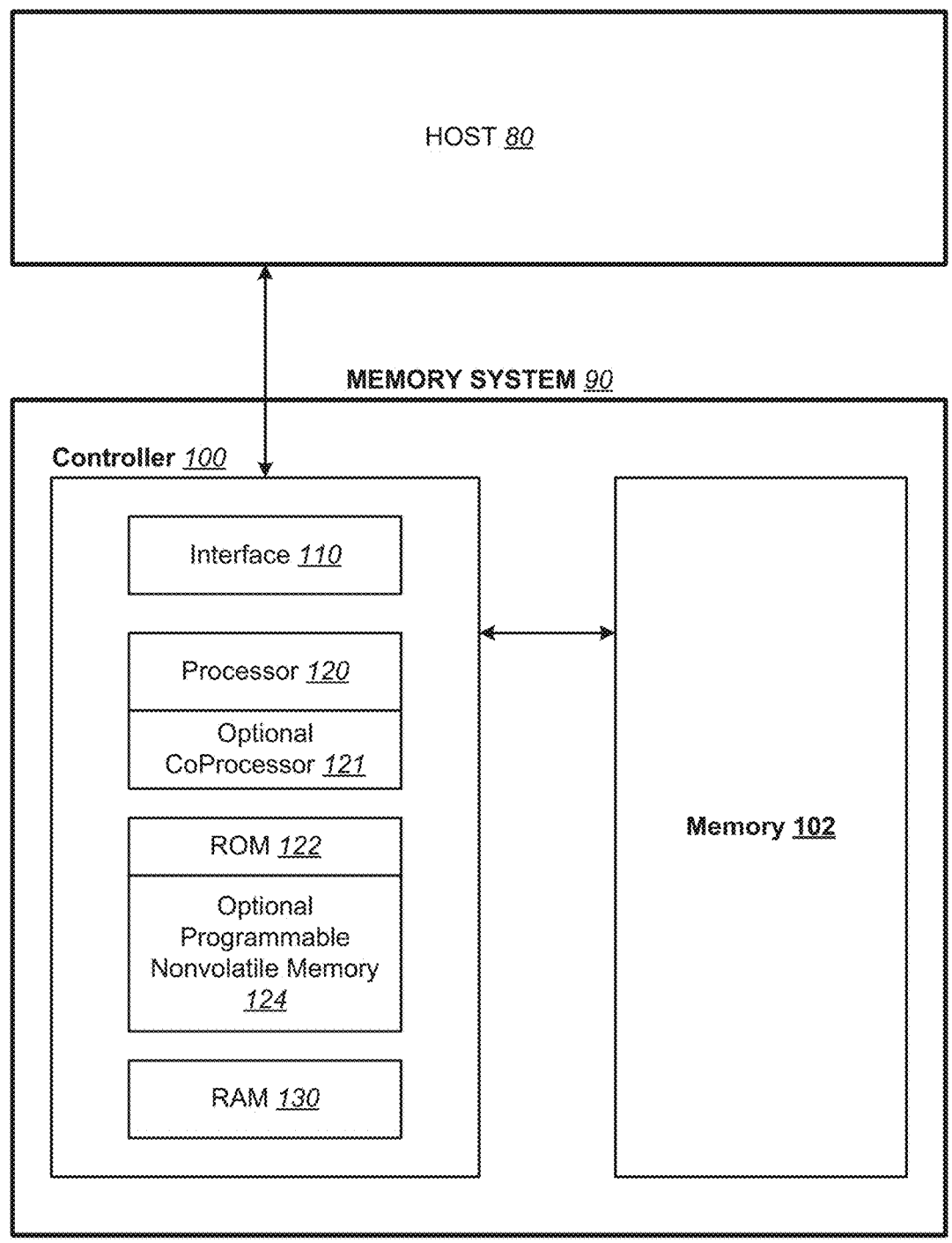
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Examples of structures may include memories other than the two dimensional and three dimensional exemplary structures described.

FIG. 1 illustrates schematically the main hardware components of a memory system suitable for implementing some examples below. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller may be formed as an ASIC (application specific integrated circuit) and the components included in such an ASIC generally depend on the particular application.

Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
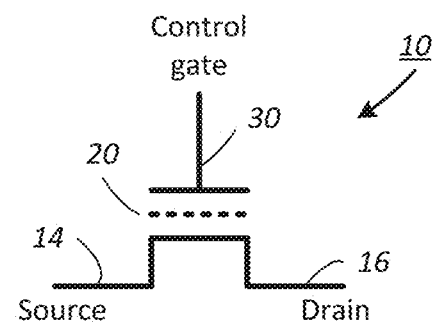
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

Figure 3:
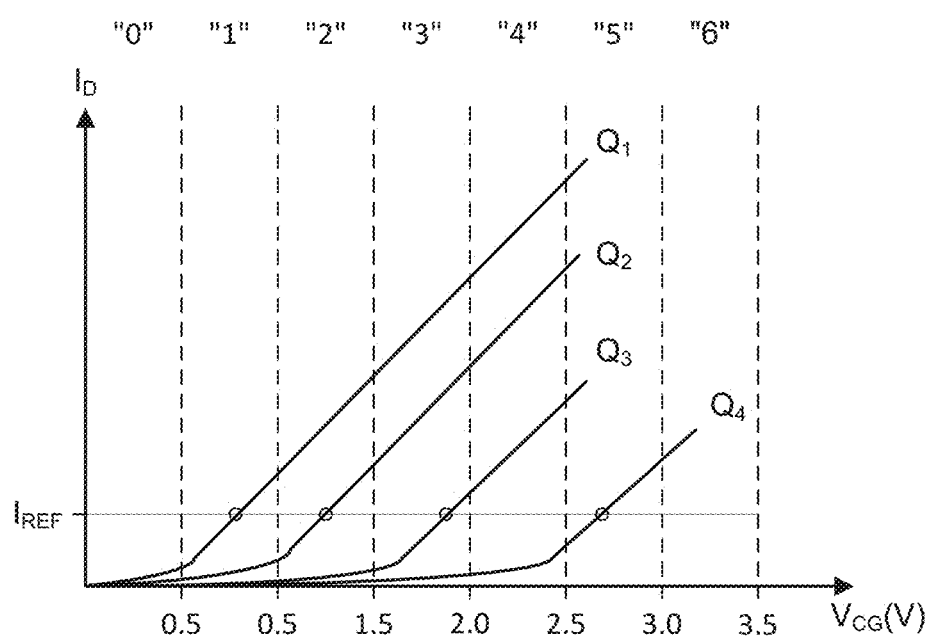
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG =0.5V and 1.0V. Similarly, Q4 is in a memory state "5".

NAND Structure

Figure 4A:
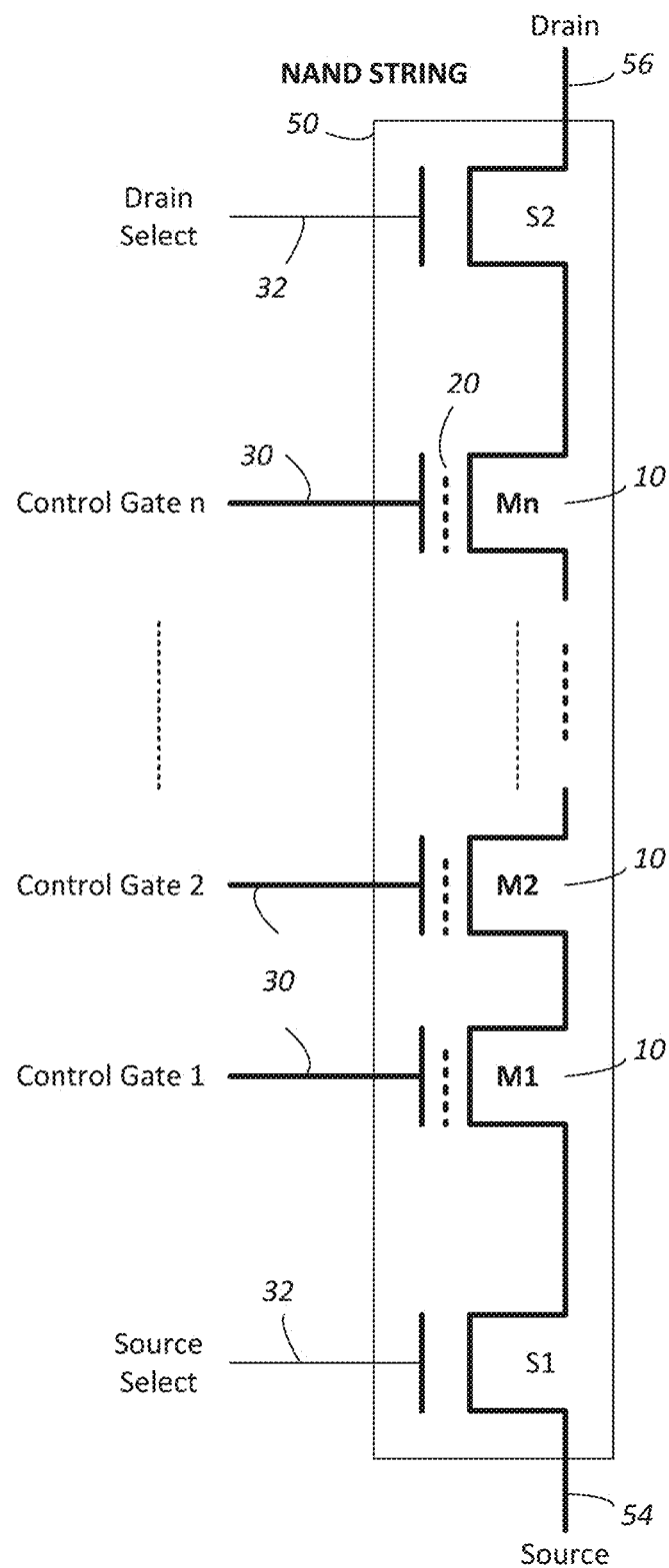
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

Figure 4B:
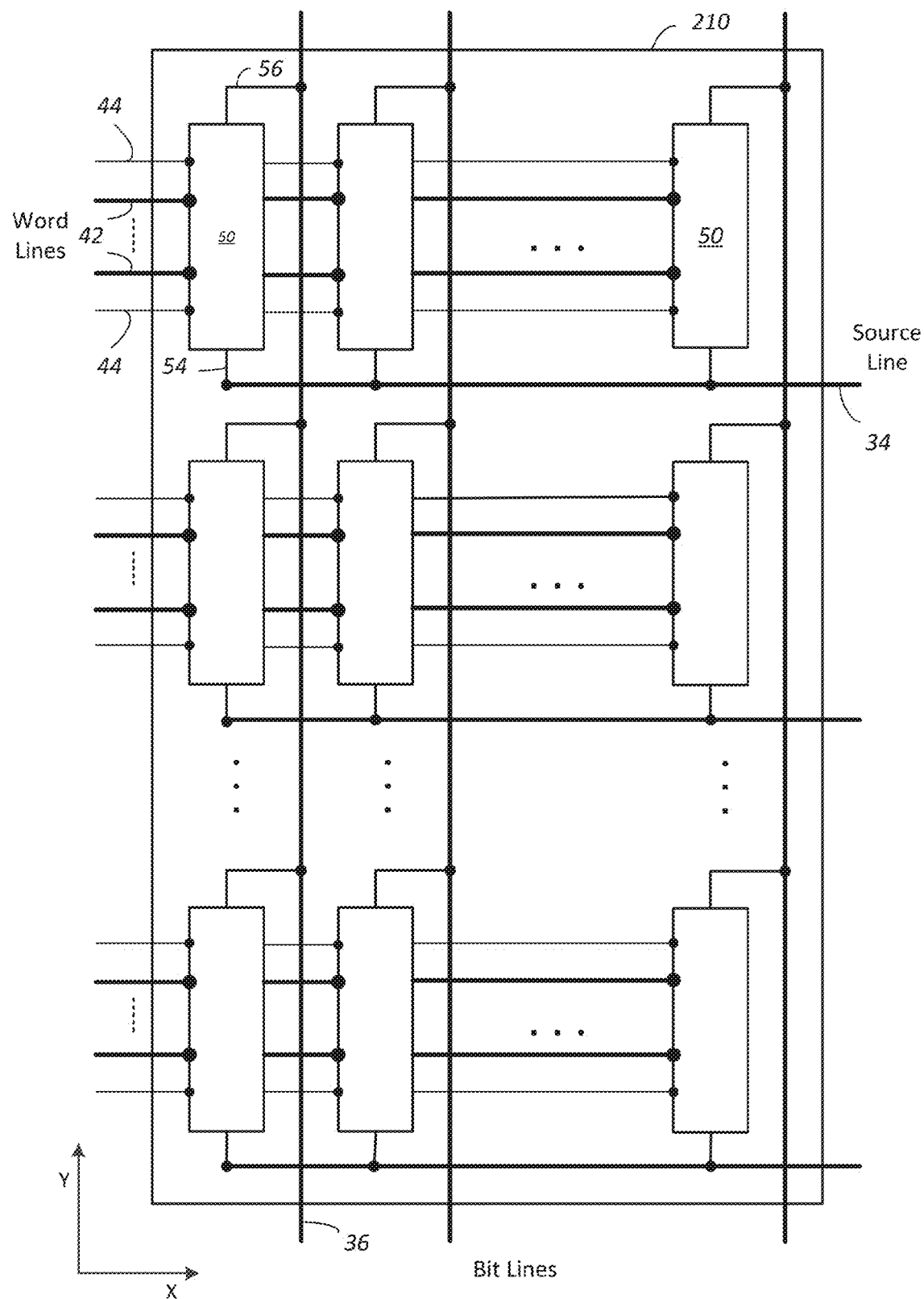
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
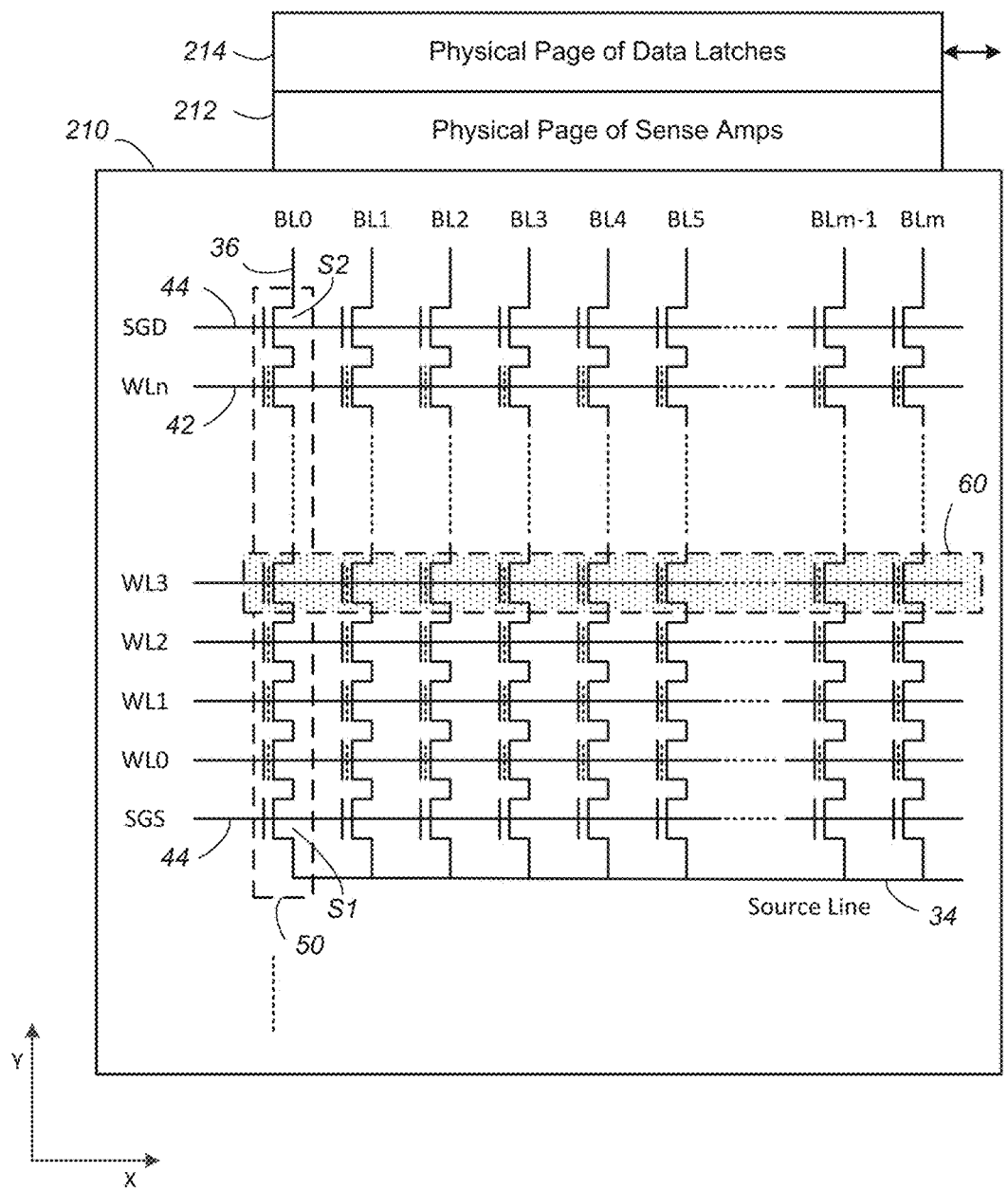
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
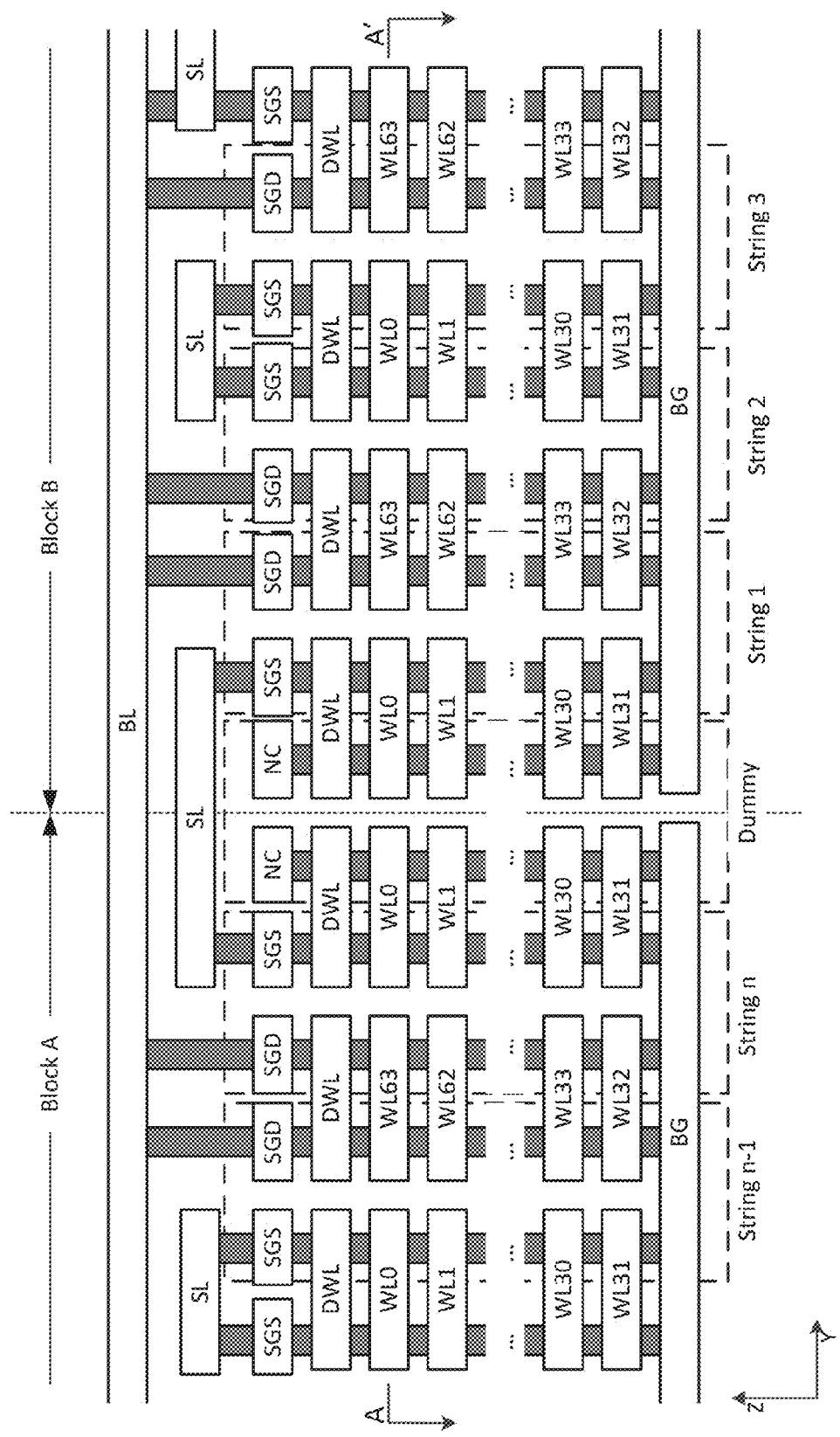
FIG. 9 shows a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL").

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end. U-shaped NAND strings conveniently allow both source and drain ends of NAND strings to be accessed on top of the memory structure so that both source and drain contacts may be formed on top.

Figure 10A:
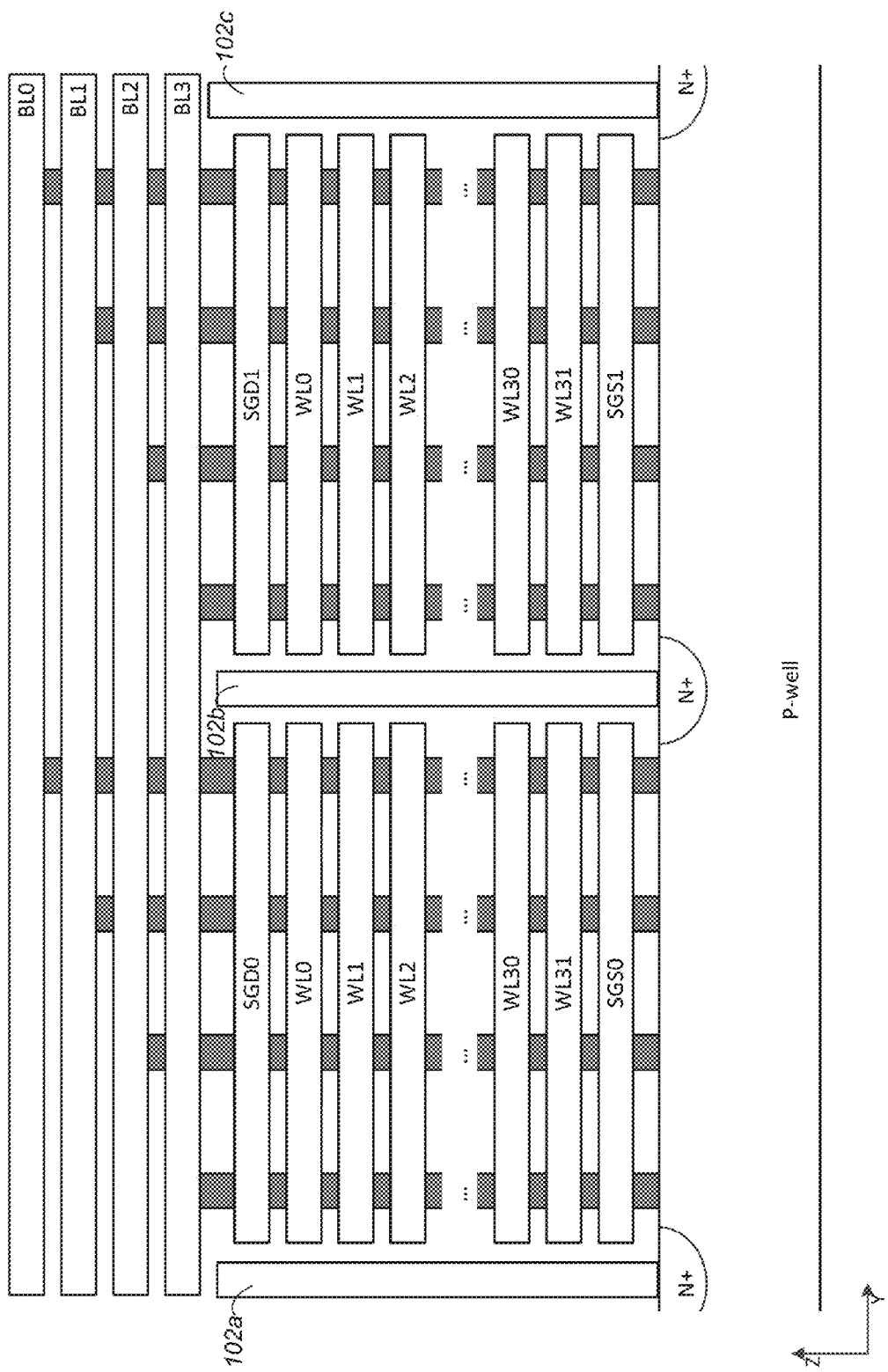
FIG. 10A shows a cross section of a 3-D NAND memory with straight NAND strings in the y-z plane.

FIG. 10A shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. FIG. 10A shows separation between word lines of different strings, e.g. WL0 in string 1 and WL0 in string 2. Memory hole structures extend down through these sheets of conductive material to form memory cells where memory holes pass through word lines. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. While only one physical level of select transistors is shown at each end of NAND strings in FIG. 10A (i.e. one level of source select transistors and one physical level of drain select transistors) in other examples, additional isolation may be provided by two or more transistors at one or both ends of NAND strings. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10A).

In FIG. 10A, the source ends of NAND strings are connected together in the substrate. Source connections may be made by forming an appropriately doped area within the substrate (e.g. by implantation of dopant ions) as indicated by areas marked "N+". Connections may be made to the P-well in the substrate at these locations. For example, source conductors 102a-c may be formed between sets of strings as shown. These conductive connections may be available for connection above the level of the memory cells (i.e. above the level of any word line). In the example of FIG. 10A a set of strings shares source and drain select lines. In other cases, select lines may be differently arranged. For example separate drain select lines and/or source select lines may be provided for different NAND strings in a set of strings.

Figure 10B:
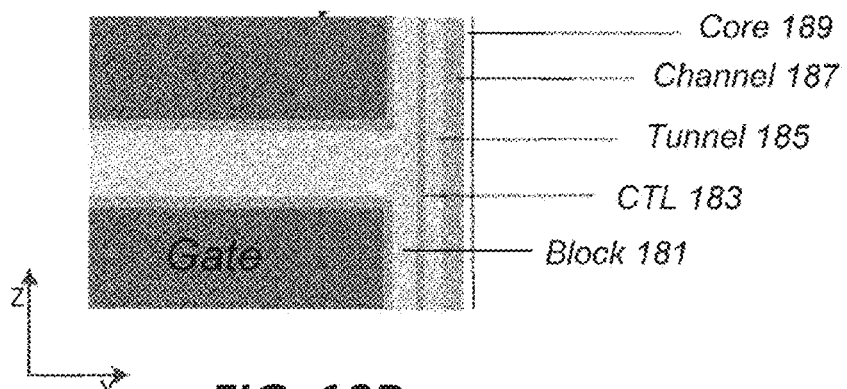
FIG. 10B illustrates a memory hole structure.

FIG. 10B shows an example of layers of material that may be used to form a memory hole structure to form a NAND string. A block layer 181 is the outermost layer that lies adjacent to the control gates (formed by a word lines) and may be formed of a suitable dielectric such as silicon oxide. A Charge Trapping Layer (CTL) 183 overlies block layer 181 and may be formed of a suitable material for trapping charge such as silicon nitride. A tunnel layer 185 lies over the CTL layer to allow tunneling of charge into CTL 183 under appropriate conditions. Tunnel layer 185 may be made of a suitable dielectric such as silicon oxide. A channel layer 187 overlies tunnel layer 185 and connects memory cells in series. Channel layer 187 may be formed of a suitable conductive material such as doped polysilicon. A core 189 fills the interior of the memory hole and may be formed of a suitable dielectric such as silicon oxide. These layers, or similar layers used to form vertical NAND strings may be formed in any suitable manner.

Figure 11A:
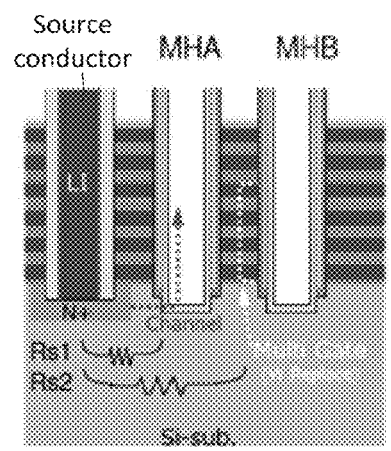
FIG. 11A shows different current pathways with different resistances.

The geometry of FIG. 10A may provide significant resistance between source conductors and some, or all, NAND strings. FIG. 11A shows an example where a source conductor connects to the source ends of two NAND strings in two memory holes (memory hole A "MHA" and memory hole B "MHB"). The metal source conductor connects to an N+ doped region in the substrate (e.g. doped with Phosphorous). The series resistance between the source conductor and the channel of MHA is Rs1 and the series resistance between the source conductor and the channel of MHB is Rs2. Because of the geometry, these resistances may be significant. In particular, Rs2 may be significant because of the relatively long current pathway between the N+ doped region of the source contact and the channel of MHB. The difference between Rs1 and Rs2 due to different current pathways may result in different characteristics for the different NAND strings (e.g. different program, read, and erase times)

Figure 11B:
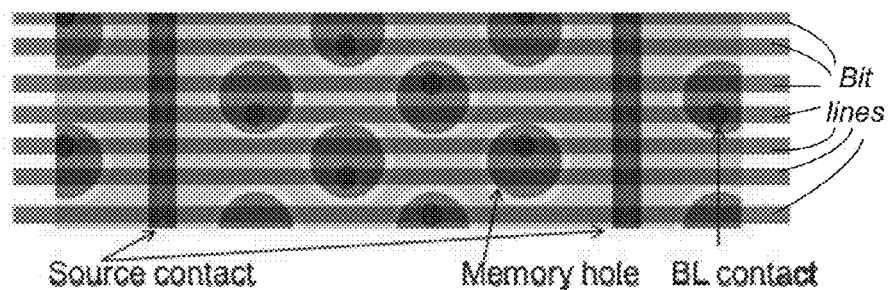
FIG. 11B shows a top-down view of the structure of FIG. 11A.

FIG. 11B shows a top-down view of the structure of FIG. 11A showing how different memory holes may be located at different distances from the nearest source contact. This variation may provide different characteristics for different NAND strings within the same block which is generally undesirable.

Figure 12A:
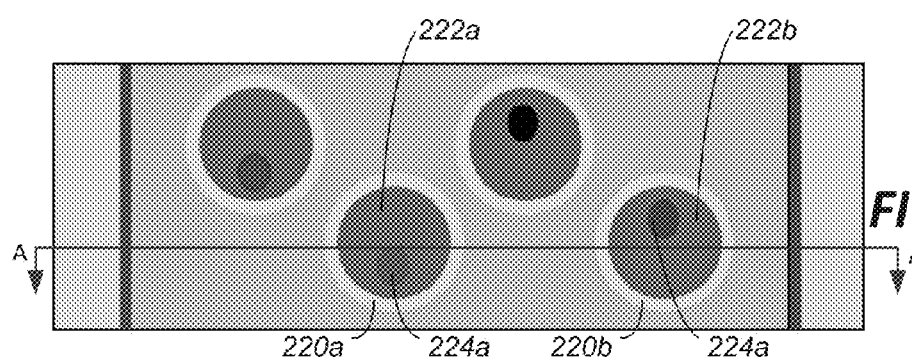
FIGS. 12A-B show memory holes that each form one NAND string.
Figure 12B:
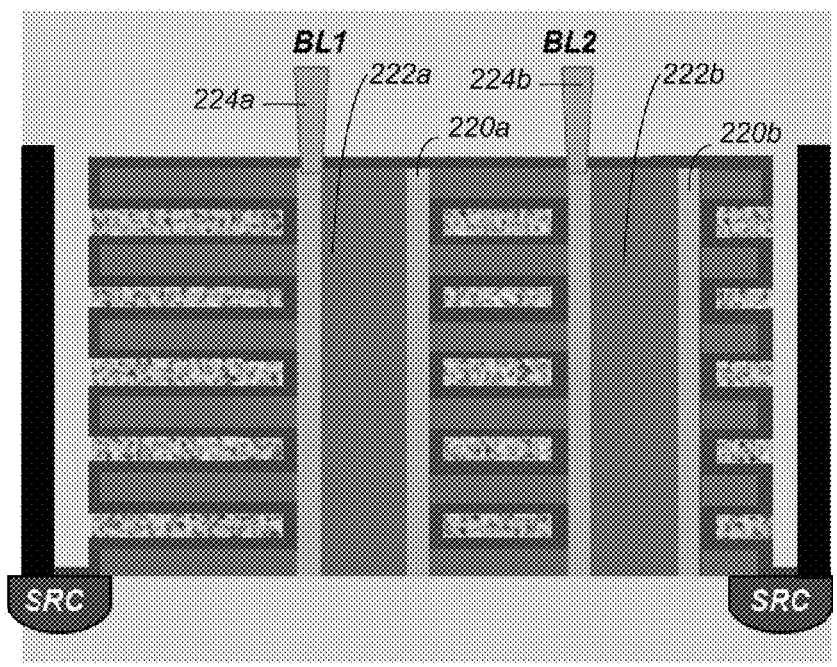

FIG. 11B also shows bit line contacts where channels (also referred to as "local bit lines" or "vertical bit lines") connect to bit lines "BL" (global bit lines, which run horizontally over the memory cells). Source conductors extend in the word line direction and may be connected together in a peripheral area. FIGS. 12A-B show bit line contacts in more detail with FIG. 12B showing a cross section along A-A' of FIG. 12A. Channels 220a-b are cylindrical in shape with centers or cores 222a-b of material that may be an insulator. Bit line contacts 224a-b may be offset so that channels of memory holes that are aligned in the bit line direction connect to different bit lines.

Figure 13A:
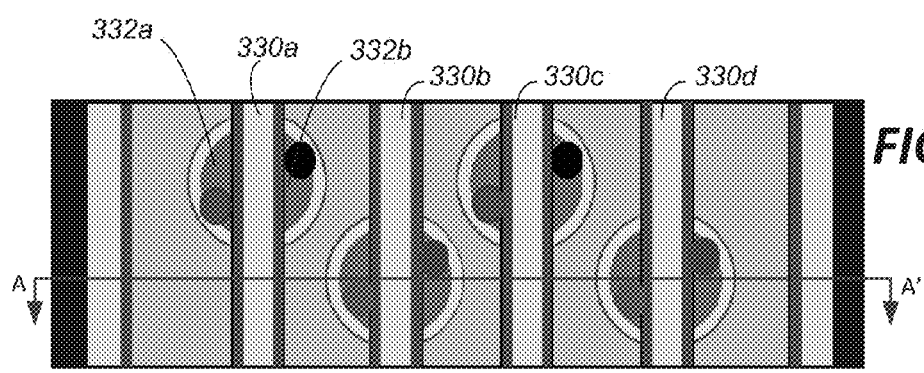
FIGS. 13A-B show memory holes bisected by trenches so that two NAND strings are formed in each memory hole.
Figure 13B:
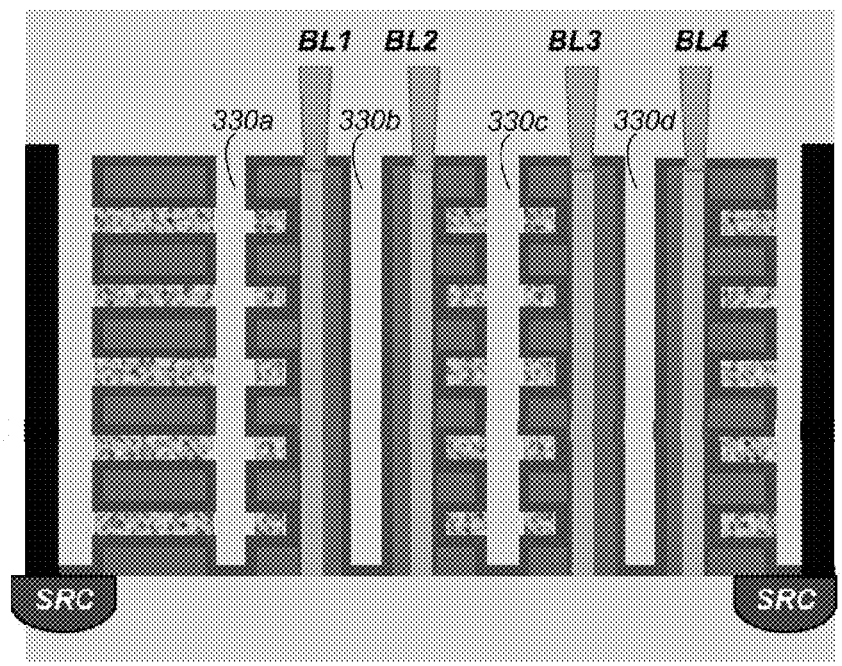

An alternative to the structure of FIGS. 12A-B is shown in FIGS. 13A-B (which show similar top-down and cross sectional views respectively). In particular, FIGS. 13A-B show a structure in which memory holes are divided in two (bisected) by trenches 330a-d that run in a direction perpendicularly to the bit line direction (i.e. along the word line direction). Such trenches divide each of the memory holes shown so that a memory hole structure is divided in two (e.g. portions 332a-b resulting from dividing a memory hole by trench 330a). The two portions thus formed include a channel portion and a charge trapping layer portion so that each remaining part of the memory hole structure may form a separate NAND string. Thus, instead of having one NAND string per memory hole as before, here two NAND strings are formed in each memory hole. This may allow the density of memory cells in the array to be increased (e.g. doubled). Alternatively, memory holes may be made larger to facilitate trenches intersecting and dividing the memory hole structures. Larger memory hole structures may be easier to make because the larger geometry facilitates etching and depositing within memory holes and may allow more physical levels of memory cells to be included in the vertical direction. For example, because the number of NAND strings per memory hole is doubled, the number of memory holes per unit area may be halved while maintaining the same density of memory cells. Separate bit line connections are formed to connect the two NAND strings to different bit lines. Source connections are formed as before in the structure of FIGS. 13A-B with implanted areas in the substrate ("SRC") connected by vertical source conductors. Separate select lines may be provided to allow NAND strings on either side of a trench to be separately selected. For example, trenches may separate a metal strip into individual select lines that can be separately biased.

Figure 14A:
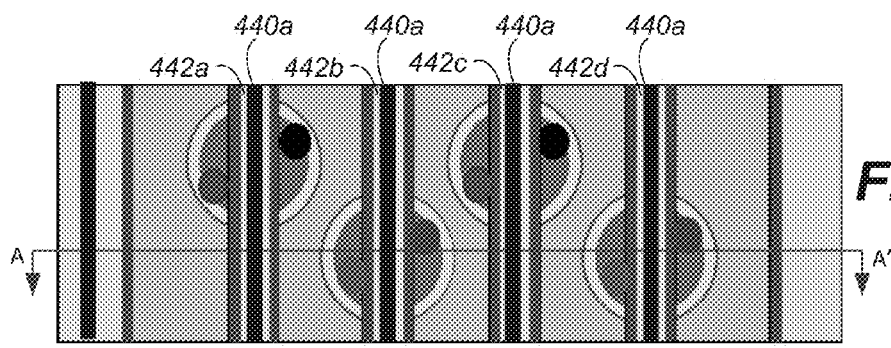
FIGS. 14A-B show memory holes bisected by trenches that contain source conductors.
Figure 14B:
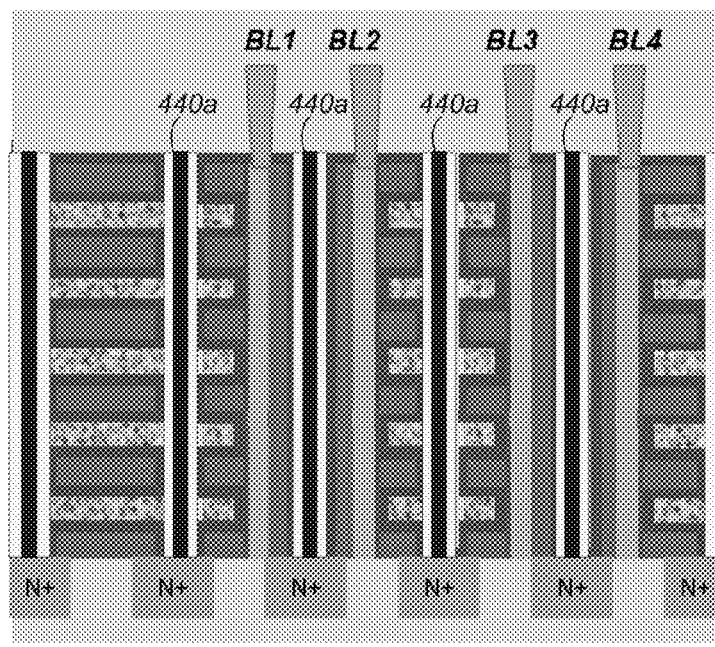

An alternative arrangement is shown in FIGS. 14A-B which show source conductors extending within trenches that bisect memory holes (in similar top-down view and cross sectional view respectively). In this example, trenches not only divide memory hole structures into separate NAND strings but also allow source conductors 440a-d to connect with NAND strings on either side using very short current pathways which provide low, uniform resistance. A pattern of trenches may be aligned with memory holes as before so that trenches bisect memory holes. Then, a dielectric layer may be deposited on the sides of the trenches to insulate the NAND strings on either side. This dielectric may be removed from the bottom of trenches to expose a portion of the substrate and may be removed from outside memory holes leaving separate portions of dielectric 442a-d. The exposed portion of the substrate may be doped (e.g. implanted with an n-type dopant to form an N+ region) at this time. Alternatively, these areas may have been doped previously (prior to formation of layers of silicon dioxide and silicon nitride) with the trench pattern aligned so that trenches expose doped areas. The doped portion of the substrate may extend beyond the immediate area that is exposed (i.e. there may be some diffusion of dopant) so that the doped are extends under channels on either side as shown ("N+"). Thus, the doped area at the bottoms of trenches may provide a common connection to channels of NAND strings on either side of the trench. A conductive metal may then be deposited in the trench so that metal lies in contact with, and makes electrical connection with, the doped portion of the substrate. In the example of FIGS. 14A-B the conductive metal forms a source conductor that is a plate of metal extending vertically between NAND strings and running laterally in the word line direction.

Process Example

A structure in which trenches divide memory hole structures into multiple NAND strings may be formed in various ways and source connections within such trenches may also be provided in various ways. Examples are provided here for illustration but it will be understood that various alternatives are also possible.

FIGS. 15A and 15B show a portion of a memory die at an intermediate stage of fabrication in cross section and top-down views respectively. FIG. 15A shows a cross section along A-A' of FIG. 15B. Subsequent figures show the same views at later stages of fabrication. Alternating layers of material disposed above a substrate. These layers may include conductive layers separated by dielectric layers, or may include sacrificial layers separated by dielectric layers (e.g. alternating layers of silicon oxide and silicon nitride) as shown here. Memory holes extend through the layers to expose the substrate ("Si Sub"), e.g. memory holes may be formed by patterning and performing anisotropic etching. Locations of memory holes alternate to facilitate connection to bit lines with two memory holes shown in FIG. 15A corresponding to a cross section along A-A'.

FIGS. 16A-B show the structure of FIGS. 15A-B (in same views) after formation of a tunnel oxide ("TuOx") a polysilicon channel ("Poly Si") and a dielectric core that extend through the memory hole to connect memory cells in the vertical direction. The polysilicon channel layer and tunnel oxide extend the entire length of the memory hole. Some etching may be required to remove tunnel oxide from the bottom of the memory hole so that the channel layer makes contact with the substrate at the bottom. A charge trapping layer and blocking dielectric may be formed with the tunnel oxide and channel layers at this time. Alternatively, the charge trapping layer and blocking dielectric layer may be formed subsequently as described below.

FIGS. 17A-B show the structure of FIGS. 16A-B after formation of a mask layer 720 and patterning of a resist layer 722 so that elongated openings in the resist layer 722 are aligned with memory holes. These elongated openings extend perpendicularly to the bit line direction. This pattern may be transferred to the mask layer 720 (e.g. a hard mask layer formed of silicon oxide or other suitable material). The mask layer may then establish the pattern during etching of underlying layers of material in the memory die.

Figure 18A:
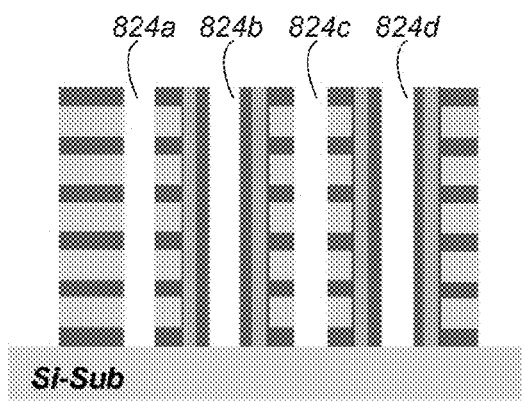
FIGS. 18A-B show the structure of FIGS. 17A-B after trench formation.
Figure 18B:
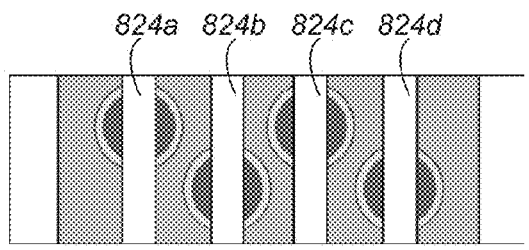

FIGS. 18A-B show the structure of FIGS. 17A-B after the mask layer 720 is used to pattern the structure. Anisotropic etching may be used with the mask layer in place so that trenches 824a-d extend vertically through the structure as shown. In particular, trenches 824a-d extend through memory holes to divide memory hole structures.

Figure 19A:
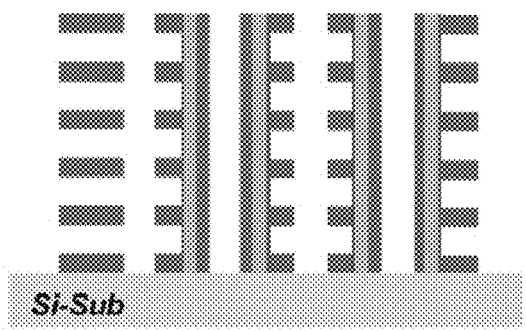
FIGS. 19A-B show the structure of FIGS. 18A-B after removal of sacrificial material.
Figure 19B:

FIGS. 19A-B show the structure of FIGS. 18A-B after removal of sacrificial silicon nitride (SiN). This leaves dielectric portions of silicon oxide and portions of tunnel oxide, channel, and core materials.

Figure 20A:
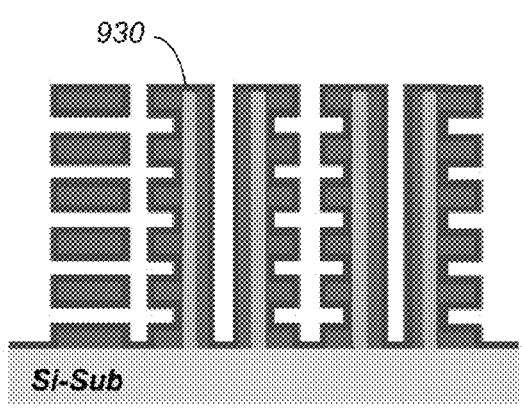
FIGS. 20A-B show the structure of FIGS. 19A-B after deposition of a layer including a charge trapping layer and blocking layer.
Figure 20B:
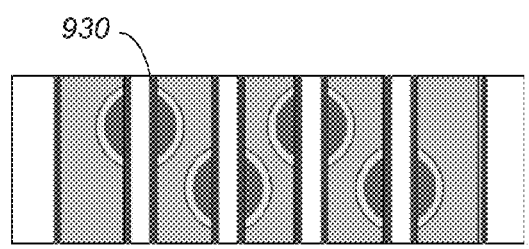

FIGS. 20A-B show the structure of FIGS. 19A-B after deposition of a layer 930 that includes a charge trapping layer (CTL) such as silicon nitride followed by a blocking layer such as silicon oxide. The charge trapping layer lies in contact with the tunnel oxide that was deposited in locations where sacrificial silicon nitride was removed. This allows charge to tunnel into the CTL at these locations under the right conditions thus forming memory cells.

FIGS. 21A-B show the structure of FIGS. 20A-B after deposition of a conductive metal 940, for example tungsten, to replace sacrificial silicon nitride. Some conductive metal also extends into trenches and over the structure shown. Excess metal is subsequently removed.

FIGS. 22A-B show the structure of FIGS. 21A-B after removal of excess metal to form separate word lines ("WL"). The word lines lie in contact with the blocking layer so that an electric field may be created between the channel and a word line by applying appropriate voltages to the channel and word line. An electric field may be used to cause charge to tunnel from the channel to the CTL (to program a memory cell) or to remove charge from the CTL (to erase the memory cell).

An insulator layer may be deposited in trenches at this stage, followed by etching to expose the substrate at the bottom of the trenches (while keeping insulator on sides of the trenches). Exposed areas of the substrate may be doped at this stage (if not previously doped) as shown by N+ areas in the substrate at bottoms of trenches. In other cases, doping occurs earlier and may occur prior to formation of layers on the substrate (which may require some alignment of trenches with previously formed N+ doped areas).

Figure 23B:
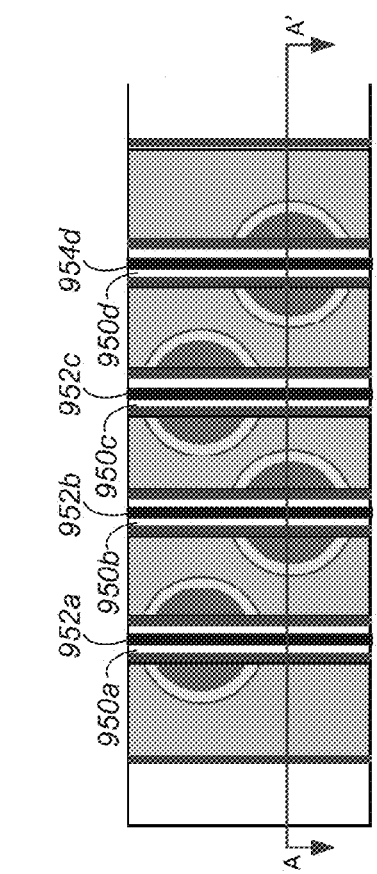
FIGS. 23A-B show the structure of FIGS. 22A-B after deposition of insulator material and conductive metal in trenches.
Figure 23A:
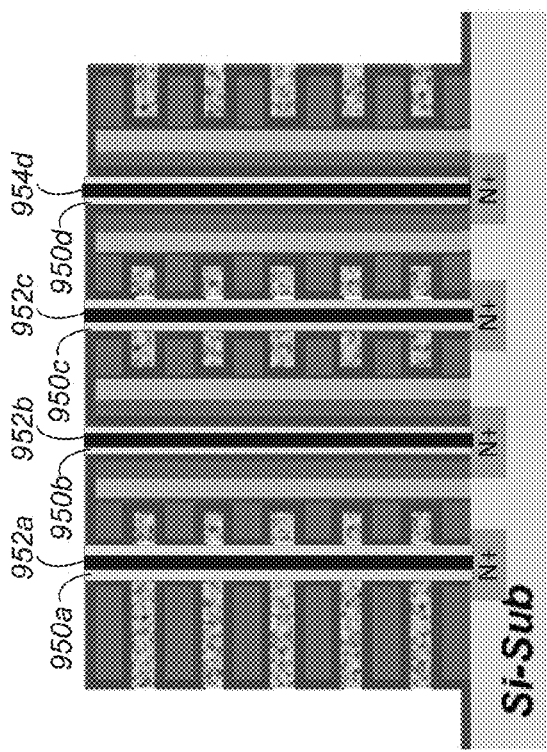

FIGS. 23A-B show insulator portions 950a-d and metal portions 952a-d formed in trenches that divide memory holes. Metal portions 952a-d extend to make contact with N+ areas in the substrate which in turn connect with channels of NAND strings. Metal portions are otherwise insulated by insulator portions 950a-d so that they do not make contact with word lines, channels or other elements.

FIGS. 24A-B show drain contacts 960a-d that connect channels to bit lines. In the arrangement shown in FIGS. 24A-B drain contact locations are offset so that drain contacts on either side of a memory hole may connect to different bit lines. Thus, the cross section along A-A' shown in FIG. 24A bisects two drain contacts of two different memory holes.

FIG. 25 is a simplified schematic that illustrates the electrical connections of FIG. 24A. It can be seen that all NAND strings shown are connected together at their source ends. While drain ends of the NAND strings connect to different bit lines (BL1-BL6) the source ends connect to source conductors "SRC." Between memory holes, source conductors connect to the substrate "Sub" so that the source conductors provide a connection to both the source ends of NAND strings and to the substrate between NAND strings so that the substrate can be appropriately biased.

Figure 26A:
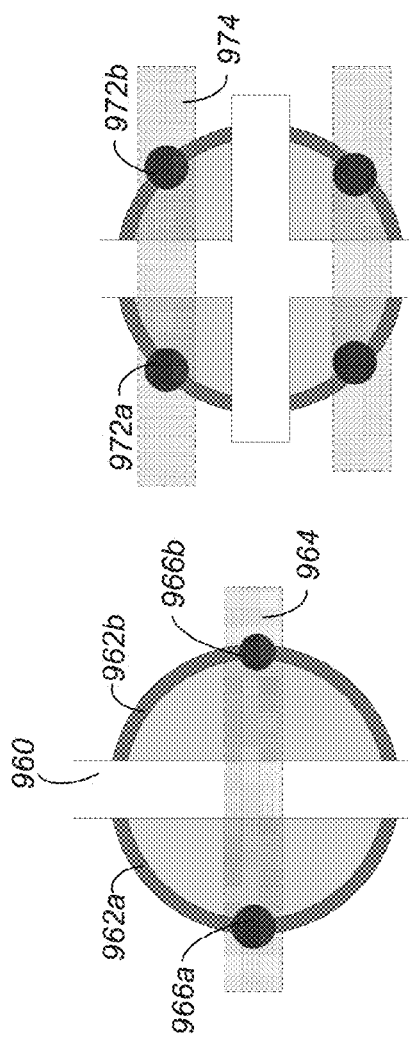
FIGS. 26A-B show drain connections for two NAND strings in a memory hole.
Figure 26B:
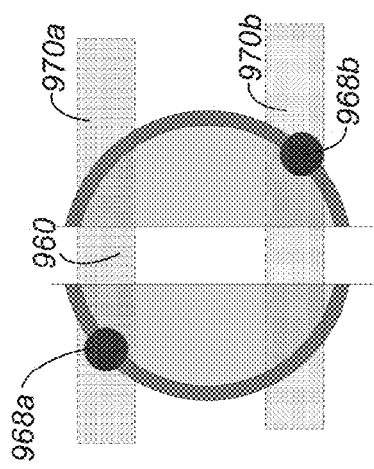

FIGS. 26A-B show examples of a bisecting trench 960 as described above. Such a trench allows two separate NAND strings to be formed and each of these NAND strings may be separately selectable by different select lines (e.g. different source select line and/or different drain select line). In the example of FIG. 26A, both channels 962a-b (both NAND strings) are connected to the same bit line 964 so that two drain contacts 966a-b, one on either side of trench 960, are connected together to common bit line 964. These channels may be separately selected by different select lines.

FIG. 26B shows an alternative arrangement in which drain contacts 968a-b of channels on different sides of bisecting trench 960 are connected to different bit lines 970a-b. Drain contacts may be offset in order to facilitate such a connection.

While the examples above show a trench that bisects a memory hole structure to form two NAND strings in a memory hole other examples are possible. In particular, dividing memory hole structures is not limited to bisecting the memory hole structures. More than two NAND strings may be formed in a memory hole by using different trench patterns.

Figure 27A:
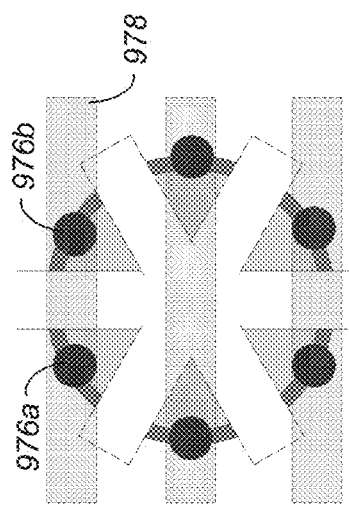
FIGS. 27A-B show drain connections for four NAND strings in a memory hole.

FIG. 27A shows an example of a trench pattern in the shape of a cross which divides a memory hole structure into four NAND strings (i.e. four separate channels are formed). In this example, drain contacts are arranged in pairs, with each pair consisting of one drain contact from each side of the primary trench. For example, contacts 972a-b form a pair connected to bit line 974. One NAND string in such a pair may be selected at a time so that NAND strings can be independently accessed.

Figure 27B:
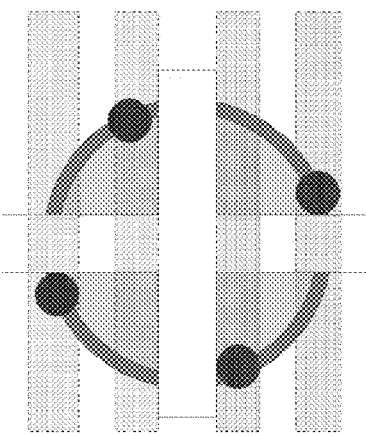

FIG. 27B shows an another arrangement in which four NAND strings in a memory hole have drain connections to four different bit lines. Locations of drain connections are offset appropriately to facilitate such connection.

Figure 28A:
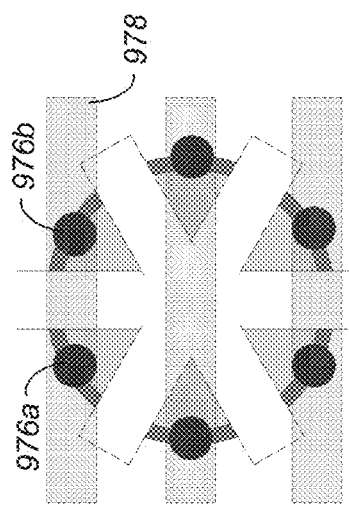
FIGS. 28A-B show drain connections for six NAND strings in a memory hole.

FIG. 28A shows an example of a memory hole structure that is divided into six separate portions (i.e. six NAND strings). Drain connections are made in pairs, with each pair consisting of one drain contact from each side of the primary trench. For example, contacts 976a-b form a pair connected to bit line 978. Thus, separately selectable NAND strings (from either side of the primary trench) are connected in parallel.

Figure 28B:
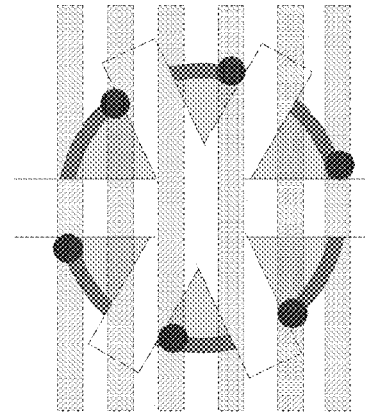

FIG. 28B shows an alternative arrangement where six NAND strings formed in a memory hole are connected to six different bit lines. It will be understood that the approach of dividing memory hole structures into multiple NAND strings in this manner is not limited to any particular number of NAND strings. Such division may allow higher memory density or may allow a similar memory density with larger memory hole structures which may make processing easier (i.e. larger memory holes are easier to form).

Conclusion

The foregoing detailed description has been presented for purposes of illustration and description. It is not intended to It is claimed:

1. A method of monolithically forming a three dimensional nonvolatile memory in two or more physical levels of memory cells having active areas disposed above a substrate comprising:
    forming a memory hole that extends through the two or more physical levels;
    forming a memory hole structure in the memory hole, the memory hole structure including a charge trapping layer and a channel layer;
    forming a vertical trench that intersects the memory hole and that divides the memory hole structure; and
    forming a vertical source conductor in the vertical trench.

2. The method of claim 1 wherein the vertical trench is aligned with a previously formed implanted area in the substrate and wherein the vertical source conductor makes contact with the implanted area.

3. The method of claim 1 wherein the vertical trench and the vertical source conductor extend to the substrate.

4. The method of claim 3 wherein the vertical trench divides the channel layer into a plurality of separate channels and the vertical source conductor is electrically connected to the plurality of separate channels at the substrate.

5. The method of claim 4 wherein the vertical source conductor is electrically connected to the substrate.

6. The method of claim 4 wherein the vertical trench divides the charge trapping layer into a plurality of separate charge trapping portions, each of the plurality of separate charge trapping portions forming charge trapping elements of a corresponding NAND string.

7. The method of claim 4 further comprising forming a plurality of drain contacts for the plurality of separate channels, each of the plurality of separate channels having a separate drain contact.

8. The method of claim 4 further comprising forming a plurality of drain contacts for the plurality of separate channels, the plurality of drain contacts connected in one or more pairs, a pair consisting of a drain contact on a first side of the vertical trench and a drain contact on a second side that is an opposing side of the vertical trench to the first side.

9. The method of claim 8 wherein a drain contact on the first side of the vertical trench connects to a first channel selected by a first select line and a drain contact on the second side of the vertical trench connect to a second channel selected by a second select line.

10. The method of claim 1 further comprising forming additional memory hole structures in additional memory holes and forming the vertical trench such that the vertical trench intersects the additional memory holes and divides the additional memory hole structures.

11. A method of monolithically forming a three dimensional nonvolatile memory in two or more physical levels of memory cells having active areas disposed above a substrate comprising:
    forming a plurality of memory holes that extend vertically through the two or more physical levels;
    forming a memory hole structure in each of the plurality of memory holes, an individual memory hole structure including a charge trapping layer and a channel layer;
    subsequently forming a vertical trench that intersects the plurality of memory holes and that divides each of the plurality of memory hole structures to form separate channels on either side of the vertical trench; and
    subsequently forming a vertical source conductor in the trench, the vertical source conductor forming a common source connection to the separate channels of the plurality of memory holes.

12. The method of claim 11 further comprising forming drain connections to the separate channels at a level above the two or more physical levels, the drain connections connecting the separate channels to bit lines.

13. The method of claim 11 wherein the vertical trench is formed at a location that is aligned with a doped area of the substrate that was doped prior to formation of the trench.

* * * * *